(12) United States Patent
Oh et al.

(10) Patent No.: US 9,634,073 B2
(45) Date of Patent: Apr. 25, 2017

(54) ORGANIC LIGHT-EMITTING DISPLAY DEVICE AND METHOD OF MANUFACTURING THE SAME

(71) Applicant: SAMSUNG DISPLAY CO., LTD., Yongin, Gyeoggi-Do (KR)

(72) Inventors: Jae-Hwan Oh, Yongin (KR); Jae-Beom Choi, Yongin (KR); Seong-Hyun Jin, Yongin (KR); Se-Hun Park, Yongin (KR); Won-Kyu Lee, Yongin (KR); Yeoung-Jin Chang, Yongin (KR)

(73) Assignee: SAMSUNG DISPLAY CO., LTD., Yongin, Gyeonggi-Do (KR)

( * ) Notice: Subject to any disclaimer, the term of this patent is extended or adjusted under 35 U.S.C. 154(b) by 14 days.

(21) Appl. No.: 14/056,530

(22) Filed: Oct. 17, 2013

(65) Prior Publication Data
US 2014/0339514 A1 Nov. 20, 2014

(30) Foreign Application Priority Data
May 16, 2013 (KR) .................. 10-2013-0056036

(51) Int. Cl.
*H01L 27/32* (2006.01)
*H01L 51/52* (2006.01)

(52) U.S. Cl.
CPC ...... *H01L 27/3258* (2013.01); *H01L 51/5209* (2013.01); *H01L 51/5265* (2013.01)

(58) Field of Classification Search
CPC ............. H01L 27/32; H01L 51/52; H01J 1/62
(Continued)

(56) References Cited

U.S. PATENT DOCUMENTS

| 4,892,847 A | 1/1990 | Reinherz |
| 6,958,490 B2 * | 10/2005 | Okamoto ................ H01L 27/12 257/40 |

(Continued)

FOREIGN PATENT DOCUMENTS

| KR | 1990-0000306 | 1/1990 |
| KR | 10-2005-0016578 | 2/2005 |

(Continued)

OTHER PUBLICATIONS

English Abstract Publication No. 10-2009-0120698 (for 10-0943187).

*Primary Examiner* — Fernando L Toledo
*Assistant Examiner* — Lawrence-Linh T Nguyen
(74) *Attorney, Agent, or Firm* — F. Chau & Associates, LLC

(57) ABSTRACT

An organic light-emitting display device includes a substrate. A buffer layer is formed on the substrate. A thin film transistor is disposed on the buffer layer. The thin film transistor includes an active layer, a gate electrode, a source electrode, a drain electrode, a first insulating layer, and a second insulating layer. An uneven pattern is formed by patterning the buffer layer. A first pixel electrode is disposed in an opening formed in the second insulating layer. The first pixel electrode includes a transparent conductive oxide. A second pixel electrode is disposed on the first pixel electrode. The second pixel electrode includes a semi-transmissive layer. An organic lighting-emitting layer is formed on the second pixel electrode. An opposite electrode is formed on the organic lighting-emitting layer.

19 Claims, 7 Drawing Sheets

(58) Field of Classification Search
USPC .......................................................... 257/40
See application file for complete search history.

(56) References Cited

U.S. PATENT DOCUMENTS

| | | | |
|---|---|---|---|
| 7,057,208 B2* | 6/2006 | Akimoto | H01L 51/5215 |
| | | | 257/59 |
| 2008/0106194 A1 | 5/2008 | Logunov et al. | |
| 2008/0124558 A1 | 5/2008 | Boek et al. | |
| 2011/0266544 A1* | 11/2011 | Park et al. | 257/59 |
| 2011/0309339 A1 | 12/2011 | You et al. | |
| 2012/0074413 A1* | 3/2012 | Kim | 257/59 |
| 2012/0321902 A1 | 12/2012 | Kohara et al. | |
| 2013/0056710 A1* | 3/2013 | Oh | H01L 27/1255 |
| | | | 257/40 |

FOREIGN PATENT DOCUMENTS

| | | |
|---|---|---|
| KR | 10-2008-0016457 | 2/2008 |
| KR | 10-2008-0041558 | 5/2008 |
| KR | 10-2008-0046401 | 5/2008 |
| KR | 10-2009-0041867 | 4/2009 |
| KR | 10-2009-0129822 | 12/2009 |
| KR | 10-0943187 | 2/2010 |
| KR | 10-2010-0058335 | 6/2010 |
| KR | 10-2010-0129644 | 12/2010 |
| KR | 10-2011-0137561 | 12/2012 |
| KR | 10-2013-0026807 | 3/2013 |
| WO | WO 2004/000745 | 12/2003 |

* cited by examiner

ORGANIC LIGHT-EMITTING DISPLAY DEVICE AND METHOD OF MANUFACTURING THE SAME

CROSS-REFERENCE TO RELATED PATENT APPLICATION

This application claims priority to Korean Patent Application No. 10-2013-0056036, filed on May 16, 2013, in the Korean Intellectual Property Office, the disclosure of which is herein incorporated by reference in its entirety.

TECHNICAL FIELD

The present invention relates to a display device, and more particularly, to an organic light-emitting display device and a method of manufacturing the organic light-emitting display device.

DISCUSSION OF THE RELATED ART

Organic light-emitting display devices are getting attention as next-generation display devices because of their low-voltage operation, light weight, thin profile, wide viewing angles, excellent contrast, and fast responses.

However, since organic light-emitting display devices may have a wide emission wavelength, light-emitting efficiency and color purity may be reduced. Also, since light emitted from an organic light-emitting layer tends to lack a particular direction, many photons emitted in arbitrary directions are internally reflected by the organic light-emitting device and thus fail to reach an actual observer, thereby reducing the light extraction efficiency of the organic light-emitting device. In order to increase light extraction efficiency, a distributed Bragg reflector (DBR) mirror may be provided in the organic light-emitting display device or a resonance structure for adjusting a thickness of an organic layer may be used. However, although the resonance structure increases light efficiency, a color shift that is dependent upon a viewing angle is caused.

SUMMARY OF THE INVENTION

The present invention provides an organic light-emitting display device, which may reduce a color shift according that is dependent upon a viewing angle by using a resonance structure having an uneven portion. The present invention also provides a method of manufacturing the organic light-emitting display device.

According to an aspect of the present invention, an organic light-emitting display device includes a substrate. A buffer layer is formed on the substrate. A thin film transistor is disposed on the buffer layer. The thin film transistor includes an active layer, a gate electrode, a source electrode and a drain electrode. A first insulating layer is disposed between the active layer and the gate electrode. A second insulating layer is disposed between the gate electrode and the source and drain electrodes. An uneven pattern unit including an uneven pattern is formed by patterning the buffer layer. A first pixel electrode is disposed in an opening formed in the second insulating layer. The first pixel electrode includes a transparent conductive oxide. A second pixel electrode is disposed on the first pixel electrode. The second pixel electrode includes a semi-transmissive layer. An organic lighting-emitting layer is formed on the second pixel electrode. An opposite electrode is formed on the organic lighting-emitting layer.

The uneven pattern unit may further include an uneven pattern formed by patterning the first insulating layer.

The uneven pattern unit may further include an uneven pattern formed by patterning the active layer.

The uneven patterns of the uneven pattern unit may share an etched surface.

The transparent conductive oxide may include indium tin oxide (ITO), indium zinc oxide (IZO), zinc oxide (ZnO), indium oxide ($In_2O_3$), indium gallium oxide (IGO), or aluminum zinc oxide (AZO).

The semi-transmissive layer may include silver (Ag), aluminum (Al), or an alloy thereof.

The opposite electrode may be a reflective electrode.

The gate electrode may include a first layer including a transparent conductive oxide and a second layer including a metal.

The organic light-emitting display device may further include a first electrode of a capacitor, which is formed from the same layer as the active layer and a second electrode of the capacitor, which includes two layers formed of the same materials as the first pixel electrode and the second pixel electrode, respectively.

The second electrode of the capacitor may be disposed in an opening formed in the second insulating layer.

The first insulating layer may be disposed between the first electrode and the second electrode.

The first electrode may include ion impurities.

The organic light-emitting display device may further include a pixel definition layer, in which an opening is formed spaced apart from the thin film transistor in a lateral direction of the thin film transistor, on the second insulating layer.

The first and second pixel electrodes may be disposed in the opening formed in the pixel definition layer.

According to an aspect of the present invention, a method of manufacturing an organic light-emitting display device includes forming a buffer layer on the substrate. A thin film transistor is disposed on the buffer layer and includes an active layer, a gate electrode, a source electrode and a drain electrode. A first insulating layer is disposed between the active layer and the gate electrode. A second insulating layer is disposed between the gate electrode and the source and drain electrodes. An uneven pattern unit includes a portion of at least the buffer layer. A first pixel electrode includes a transparent conductive oxide and a second pixel electrode includes a semi-transmissive layer on the uneven pattern unit. An organic lighting-emitting layer is formed on the second pixel electrode. An opposite electrode is formed on the organic lighting-emitting layer.

The second pixel electrode may be formed after forming the source electrode and the drain electrode.

The method may further include forming a first electrode of a capacitor from the same layer as the active layer. A second electrode of the capacitor may include two layers formed from the same layers as the first pixel electrode and the second pixel electrode, respectively.

The active layer may be doped with ion impurities in a first doping process, and the first electrode of the capacitor may be doped with ion impurities in a second doping process.

An upper layer of the two layers of the second electrode may be formed after forming the source electrode and the drain electrode.

An organic light-emitting display device according to an embodiment of the present invention and a method of manufacturing the same may reduce a color shift that is dependent upon a viewing angle by using a resonance structure including an uneven portion.

BRIEF DESCRIPTION OF THE DRAWINGS

The above and other features and aspects of the present invention will become more apparent by describing in detail exemplary embodiments thereof with reference to the attached drawings in which.

DETAILED DESCRIPTION OF THE INVENTION

Figure 1:
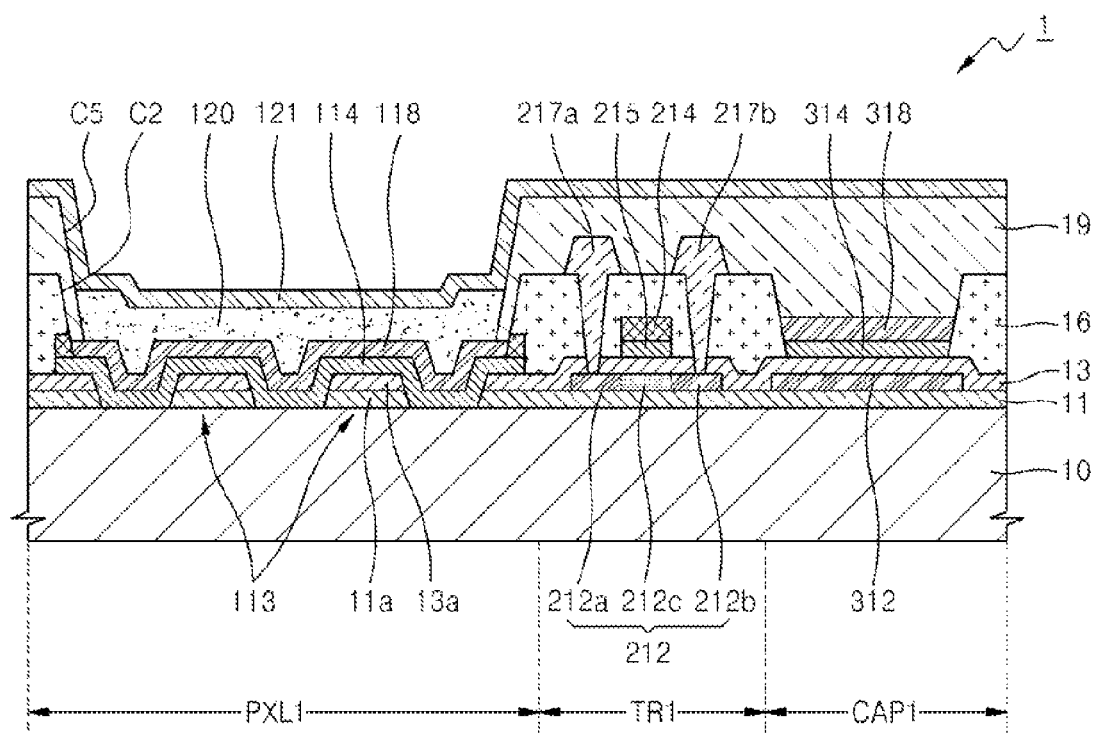
FIG. 1 is a cross-sectional view illustrating an organic light-emitting display device according to an embodiment of the present invention.

The present invention will now be described more fully with reference to the accompanying drawings. The invention may, however, be embodied in many different forms and should not be construed as being limited to the embodiments set forth herein; rather, these embodiments are provided so that this disclosure will be thorough and complete, and will fully convey the concept of the invention to those of ordinary skill in the art.

Also, parts in the drawings unrelated to the detailed description are omitted to ensure clarity of the present invention. Like reference numerals in the drawings may denote like elements.

In the drawings, sizes and thicknesses of elements may be exaggerated for convenience of explanation, and thus the invention is not limited to the sizes and thicknesses as shown.

FIG. 1 is a cross-sectional view illustrating an organic light-emitting display device 1 according to an embodiment of the present invention.

Referring to FIG. 1, a substrate 10 includes a pixel area PXL1, a transistor area TR1, and a capacitor area CAP1.

The substrate 10 may be a transparent substrate, such as a glass substrate or a plastic substrate including polyethylene terephthalate (PET), polyethylene naphthalate (PEN), or polyimide.

A buffer layer 11 is disposed on the substrate 10. The buffer layer 11 may be an insulating film having a single or multi-layer structure formed of silicon nitride and/or silicon oxide. The buffer layer 11 may prevent the penetration of impurity elements into the substrate 10, and may planarize the substrate 10.

In the pixel area PXL1, an uneven pattern 11a, which is formed by patterning the buffer layer 11, and an uneven pattern 13a, which is formed by patterning a first insulating layer 13, constitute an uneven pattern unit 113, as explained below.

An active layer 212 is disposed on the buffer layer 11. The active layer 212 may be formed of a semiconductor including amorphous silicon or polysilicon. The active layer 212 may include a source region 212a and a drain region 212b that are doped with ion impurities, and a channel region 212c between the source region 212a and the drain region 212b. The active layer 212 is not limited to a semiconductor including amorphous silicon or polysilicon, and may include an oxide semiconductor.

In the transistor area TR1, a gate electrode is disposed on the active layer 212 with the first insulating layer 13, which is a gate insulating film, between the gate electrode and the active layer 212 at a position corresponding to the position of the channel region 212c of the active layer 212.

The gate electrode includes a first layer 214 including a transparent conductive oxide and a second layer 215 including a metal, which are disposed on the first insulating layer 13 in this order. The first layer 214 may include indium tin oxide (ITO), indium zinc oxide (IZO), zinc oxide (ZnO), indium oxide ($In_2O_3$), indium gallium oxide (IGO), or aluminum zinc oxide (AZO). The second layer 215 may have a single or multi-layer structure including aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), or copper (Cu).

A source electrode 217a and a drain electrode 217b, which are respectively connected to the source region 212a and the drain region 212b of the active layer 212, are disposed on the gate electrode with a second insulating layer 16, which is an interlayer insulating film, between the source and drain electrodes 217a and 217b and the gate electrode. Each of the source electrode 217a and the drain electrode 217b may include Al, Pt, Pd, Ag, Mg, Au, Ni, Nd, Ir, Cr, Li, Ca, Mo, Ti, W, or Cu, and may have a single or multi-layer structure.

A third insulating layer 19 is disposed on the second insulating layer 16 and covers the source electrode 217a and the drain electrode 217b. The third insulating layer 19 may be an organic insulating film.

The third insulating film 19 exposes the pixel area PXL1, and the uneven pattern unit 113 is formed in the pixel area PXL1. The buffer layer 11 and the first insulating layer 13 extending to the pixel area PXL1 respectively are patterned to form the uneven patterns 11a and 13a sharing the etched surface and constituting the uneven pattern unit 113.

The buffer layer 11 and the first insulating layer 13 may be used to form the uneven pattern unit 113. The uneven pattern unit 113 may be an insulating layer having a single or multi-layer structure. The buffer layer 11 and the first insulating layer 13 may be formed of materials having different refractive indices. Since a plurality of insulating layers form a distributed Bragg reflector (DBR) resonance structure, the light extraction efficiency and color reproduction quality of the organic light-emitting display device 1 may be increased. Also, a color shift at a side surface of the organic light-emitting display device 1 may be efficiently reduced as a result of the uneven pattern. Each of the buffer layer 11 and the first insulating layer 13 may include SiNx, $SiO_2$, SiON, $HfO_2$, $Si_3N_4$, $ZrO_2$, $TiO_2$, $Ta_2O_4$, $Ta_2O_5$, $Nb_2O_5$, $Al_2O_3$, BST, or PZT.

Figure 3A:
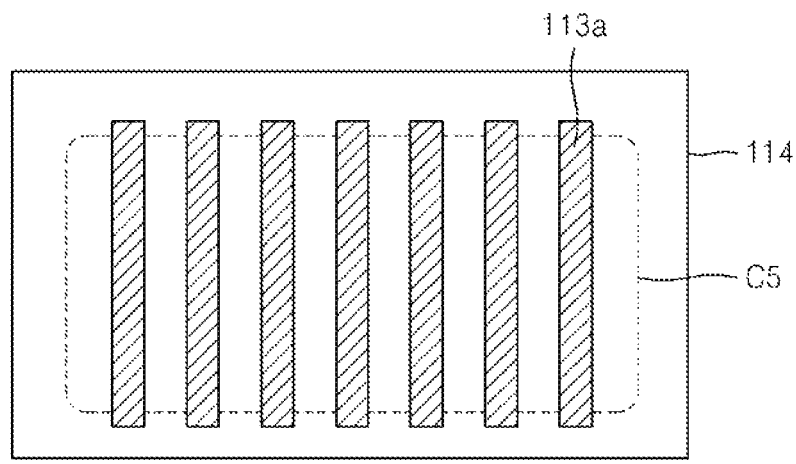
FIGS. 3A through 3D are plan views illustrating various uneven pattern units according to embodiments of the present invention.
Figure 3B:
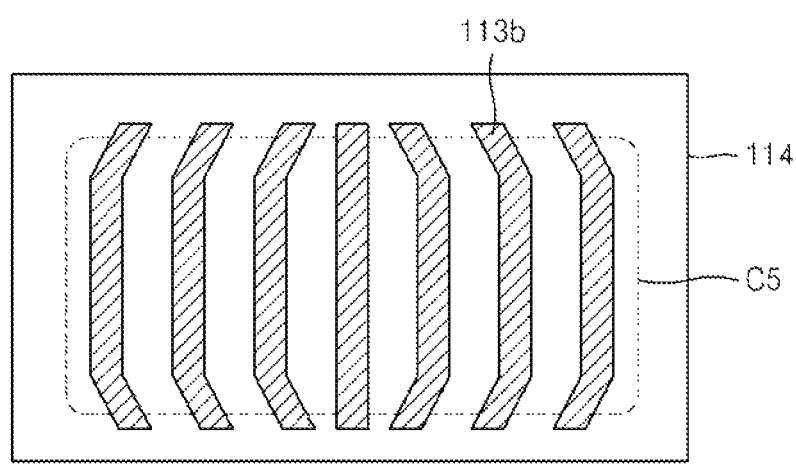
Figure 3C:
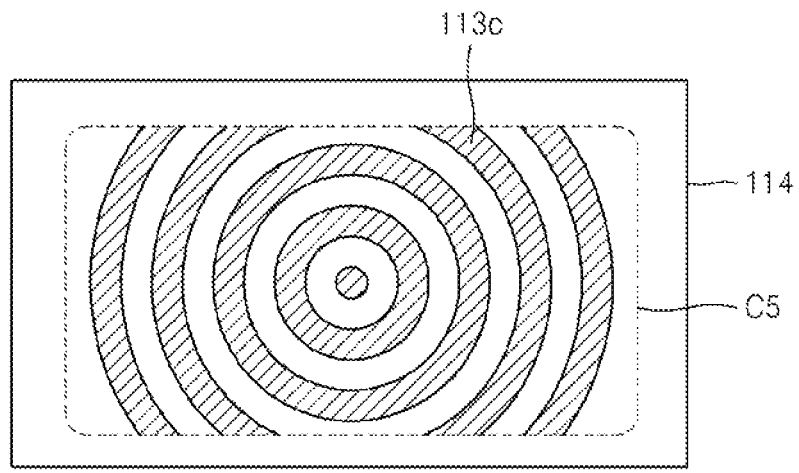
Figure 3D:
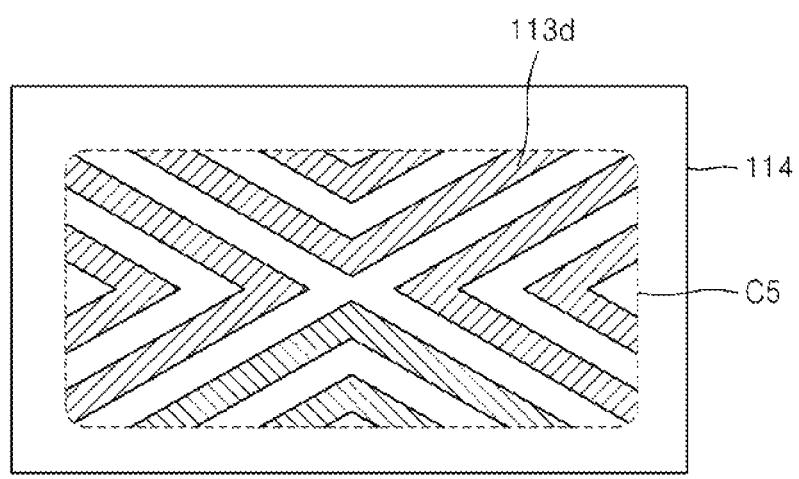

FIGS. 3A through 3D are plan views illustrating various uneven pattern units 113a, 113b, 113c, and 113d according to embodiments of the present invention. FIG. 3A shows the uneven pattern unit 113a having a stick shape, and FIG. 3B shows the uneven pattern unit 113b having a shape in which both ends of a stick are bent symmetrically. FIG. 3C shows the uneven pattern unit 113c having a circular shape, and FIG. 3D shows the uneven pattern unit 113d having a chevron shape. However, the present invention is not limited thereto, and the uneven pattern unit 113 may be manufactured to have any of various other shapes, such as a triangular shape, a pentagonal shape, and the like.

Referring back to FIG. 1, a first pixel electrode 114 is formed on the uneven pattern unit 113 along an uneven pattern. The first pixel electrode 114 may be formed of a transparent conductive oxide. The transparent conductive oxide may include indium tin oxide (ITO), indium zinc oxide (IZO), zinc oxide (ZnO), indium oxide ($In_2O_3$), indium gallium oxide (IGO), and aluminum zinc oxide (AZO).

A second pixel electrode 118 is formed on the first pixel electrode 114. The second pixel electrode 118 may be a semi-transmissive metal layer including silver (Ag), aluminum (Al), and an alloy thereof.

Although not illustrated in detail in FIG. 1, the second pixel electrode 118 may have a multi-layer structure including a semi-transmissive metal layer. For example, the second pixel electrode 118 may include a first layer including a transparent conductive oxide, a second layer including a semi-transmissive metal layer, and a third layer including a transparent conductive oxide, which are sequentially formed. The first layer including a transparent conductive oxide that contacts the first pixel electrode 114 may reduce a contact stress between the first pixel electrode 114 and the second pixel electrode 118. The third layer including a transparent conductive oxide that contacts an intermediate layer including an organic lighting-emitting layer 120 may reduce a work function difference between the semi-transmissive metal layer and the intermediate layer.

Since an opposite electrode 121, which is a reflective electrode, and the second pixel electrode 118, which is a semi-transmissive electrode, constitute a resonant mirror, light emitted from the organic lighting-emitting layer 120 is resonated between the second pixel electrode 118 and the opposite electrode 121. Accordingly, the light efficiency of the organic light-emitting display device 1 may be increased.

For example, if the second pixel electrode 118, which is a semi-transmissive electrode, includes Ag and is formed after the formation of the source electrode 217a and the drain electrode 217b, the Ag may be damaged in an etching process for forming the source electrode 217a and the drain electrode 217b. However, according to exemplary embodiments of the present invention, since the second pixel electrode 118, including a semi-transmissive metal layer, is formed after the formation of the source electrode 217a and the drain electrode 217b, damage to the second pixel electrode 118 may be prevented.

The intermediate layer (not shown), including the organic light-emitting layer 120, is disposed on the second pixel electrode 118. The organic light-emitting layer 120 may be formed of a low molecular weight organic material or a high molecular weight organic material. When the organic light-emitting layer 120 is formed of a low molecular weight organic material, a hole transport layer (HTL), a hole injection layer (HIL), an electron transport layer (ETL), and an electron injection layer (EIL) may be stacked on the intermediate layer. Various other layers may be stacked where desired. For example, the low molecular weight organic material may include copper phthalocyanine (CuPc), N'-diphenyl-benzidine (NPB), and/or tris-8-hydroxyquinoline aluminum (Alq3). When the organic light-emitting layer 120 is formed of a high molecular weight organic material, however, the intermediate layer might include an HTL. The HTL may be formed of poly-(3,4)-ethylene-dihydroxy thiophene (PEDOT) or polyaniline (PANI). For example, the high molecular weight organic material may include a polyphenylene vinylene (PPV)-based high molecular weight organic material and/or a polyfluorene-based high molecular weight organic material. In the organic light-emitting layer 120, subpixels emitting red, green, and blue light may constitute one unit pixel.

Although the organic light-emitting layer 120 is formed in an opening C5 and a separate light-emitting material is formed according to each pixel in FIG. 1, the present invention is not limited thereto. The organic light-emitting layer 120 may be formed on the third insulating layer 19 irrespective of positions of pixels. For example, the organic light-emitting layer 120 may be formed by vertically stacking or mixing layers including light-emitting materials emitting red, green, and blue light. Where white light is emitted, other colors may be combined. In addition, the organic light-emitting display device 1 may further include a color conversion layer, converting the emitted white light to a predetermined color, or a color filter.

Although the intermediate layer is not illustrated in detail in FIG. 1, various layers included in the intermediate layer, except the organic light-emitting layer 120, may be formed as common layers for all pixels or may be partially formed for each pixel. In addition, the intermediate layer may have a different thickness for each pixel where desired. The intermediate layer may be formed of an organic material. However, the present invention is not limited thereto, and the intermediate layer may include an inorganic material.

The opposite electrode 121 is deposited as a common electrode on the organic light-emitting layer 120. The opposite electrode 121 may be formed as a common electrode. In the organic light-emitting display device 1, the first pixel electrode 114 and the second pixel electrode 118 are used as an anode and the opposite electrode 121 is used as a cathode. Alternatively, the first pixel electrode 114 and the second pixel electrode 118 may be used as a cathode, and the opposite electrode 121 may be used as an anode.

The opposite electrode 121 may be a reflective electrode including a reflective material. The opposite electrode 121 may include Ag, Al, Gm, Li, Ca, LiF/Ca, or LiF/Al.

Since the opposite electrode 121 is a reflective electrode, light emitted from the organic light-emitting layer 120 is reflected by the opposite electrode 121, is transmitted through the first pixel electrode 114 formed of a transparent conductive material, and is emitted toward the substrate 10. For example, due to the DBR resonance structure of the buffer layer 11 and the first insulating layer 13, the light extraction efficiency and color reproduction quality of the organic light-emitting display device 1 may be increased and a color shift may be reduced due to an uneven structure formed by the buffer layer 11 and the first insulating layer 13.

In the capacitor area CAP1, a first electrode 312 of a capacitor is formed from the same layer as the active layer 212 on the substrate 10. The first electrode 312 may include a semiconductor doped with ion impurities that are the same as those with which the source electrode 212a and the drain electrode 212b are doped. If the first electrode 312 is formed of a pure semiconductor, not doped with ion impurities, the capacitor has a metal oxide semiconductor (MOS) capacitor structure. However, if the first electrode 312 is formed of a semiconductor doped with ion impurities as discussed above, the capacitor has a metal-insulator-metal (MIM) capacitor structure whose capacitance is larger than that of the MOS capacitor structure, thereby maximizing capacitance thereof. Accordingly, the MIM capacitor structure may implement the same capacitance with an area that is smaller than that of the MOS capacitor structure. Thus, a margin for reduction of the area of the capacitor increases, and thus, the first and second pixel electrodes 114 and 118 may be formed to have a relatively large size to increase an aperture ratio.

The first insulating layer 13 extends to form a dielectric film of the capacitor. A second electrode of the capacitor, which is formed of the same material as the first and second pixel electrodes 114 and 118, is formed on the first insulating layer 13. The second electrode includes a first layer 314 and a second layer 318, wherein the first layer 314 includes a transparent conductive oxide like the first pixel electrode 114 and the second layer 318 includes a semi-transmissive metal layer like the second pixel electrode 118.

The third insulating layer 19 is disposed on the second electrode of the capacitor. Since the third insulating layer 19 including an organic insulating material having a low dielectric constant is interposed between the opposite electrode 121 and the second electrode, a parasitic capacitance which may be formed between the opposite electrode 121 and the second electrode of the capacitor may be reduced, thereby preventing signal interference due to the parasitic capacitance.

Although not illustrated in FIG. 1, the organic light-emitting display device 1 may further include an encapsulating member for encapsulating a display area including the pixel area PXL1, the transistor area TR1, and the capacitor area CAP1. The encapsulating member may be formed of a substrate including a glass material, a metal film, or an encapsulating film in which an organic insulating film and an inorganic insulating film are alternately disposed.

FIGS. 2A through 2G are cross-sectional views sequentially illustrating a method of manufacturing the organic light-emitting display device 1 of FIG. 1, according to an embodiment of the present invention.

Figure 2A:
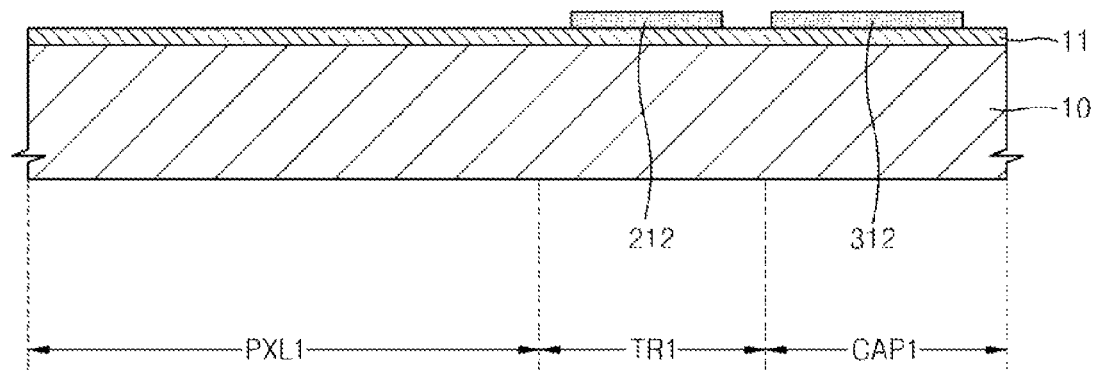
FIGS. 2A through 2G are cross-sectional views sequentially illustrating a method of manufacturing the organic light-emitting display device of FIG. 1, according to an embodiment of the present invention.

Referring to FIG. 2A, illustrating a resultant structure of a first masking process, the buffer layer 11 is formed on the substrate 10, and the active layer 212 and the first electrode 312 of the capacitor are formed on the buffer layer 11.

Although not shown in FIG. 2A, a semiconductor layer (not shown) is formed on the buffer layer 11 and a photoresist (not shown) is applied. Next, the semiconductor layer is patterned by photolithography using a first mask (not shown) to form the active layer 212 and the first electrode 312 of the capacitor.

The semiconductor layer may include amorphous silicon or crystalline silicon. Crystalline silicon may be formed by crystallizing amorphous silicon. Amorphous silicon may be crystallized by using any of various methods such as rapid thermal annealing (RTA), solid phase crystallization (SPC), excimer laser annealing (ELA), metal-induced crystallization (MIC), metal-induced lateral crystallization (MILC), sequential lateral solidification (SLS), and the like. The semiconductor layer (not shown) is not limited to amorphous silicon or crystalline silicon, and may include other materials, for example, an oxide semiconductor.

The first masking process using photolithography includes performing exposure using an exposure device on the first mask, and performing a series of processes, for example, developing, etching, stripping, and ashing. It may be assumed that subsequent masking processes may be performed in a manner similar to described herein with respect to the first masking process.

Figure 2B:
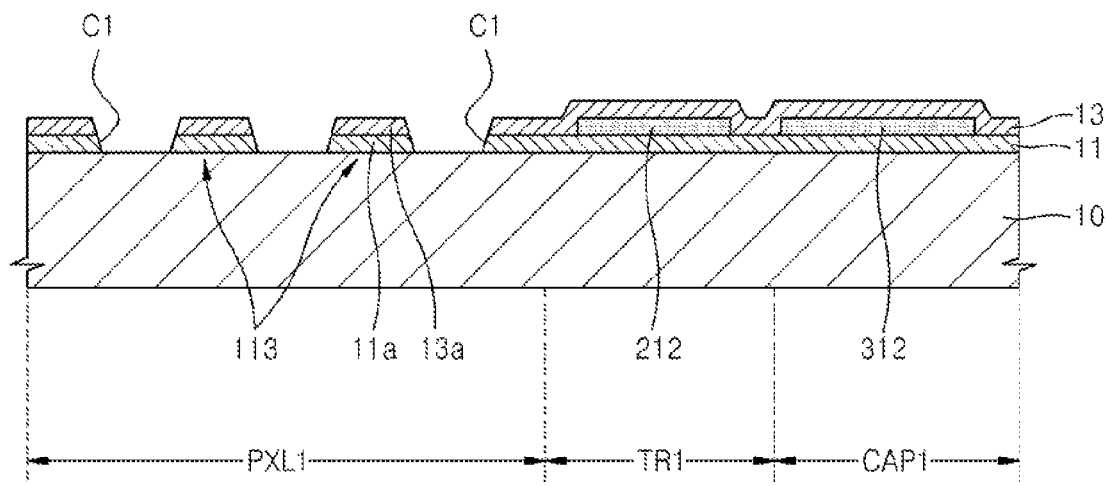

Referring to FIG. 2B, the first insulating layer 13 is formed on an entire surface of the resultant structure of the first masking process of FIG. 2A, and then a second masking process is performed to form a plurality of first openings C1 in the buffer layer 11 and the first insulating layer 13 and to thereby form the uneven pattern unit 113.

The uneven pattern 11a of the buffer layer 11 and the uneven pattern 13a of the first insulating layer 13 may share an etched surface. A color shift may be effectively prevented by forming the etched surface as a slope to increase a total slope area of the uneven pattern unit 113.

Figure 2C:
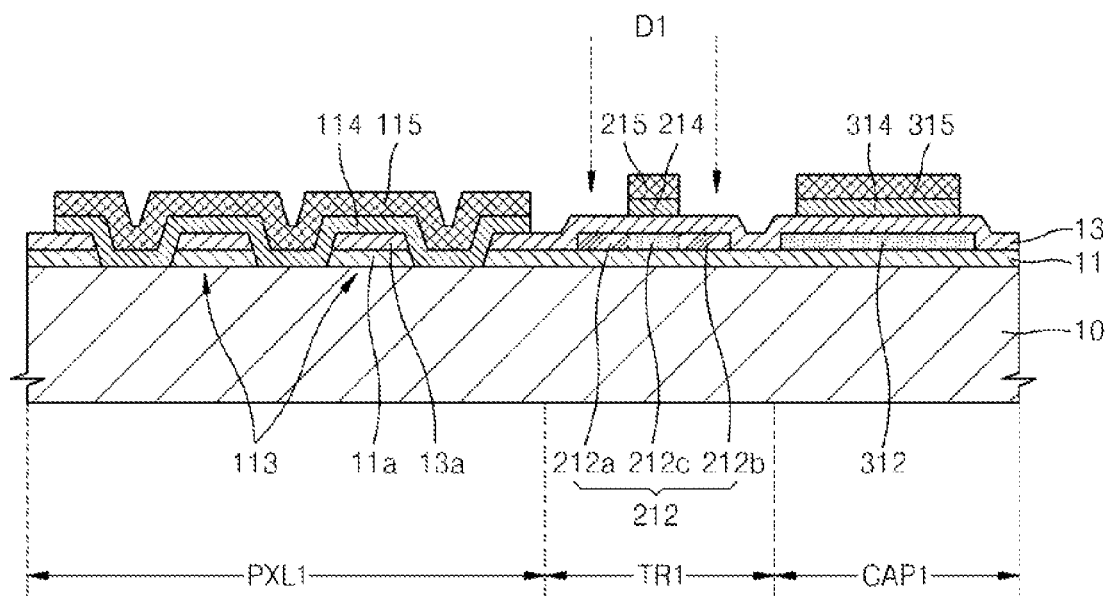

Referring to FIG. 2C, a transparent conductive oxide (not shown) and a first metal layer (not shown) are sequentially deposited on a surface of the resultant structure of the second masking process of FIG. 2B, and then a third masking process is performed to pattern the transparent conductive oxide (not shown) and the first metal layer (not shown). The first metal layer (not shown) may have a single or multi-layer structure including at least one metal selected from the group consisting of Al, Pt, Pd, Ag, Mg, Au, Ni, Nd, Ir, Cr, Li, Ca, Mo, Ti, W, and Cu.

As a result of patterning, the first and second layers 214 and 215 of the gate electrode the first layer 314 of the second electrode of the capacitor, and an upper layer 315 of the second electrode are formed, and the first pixel electrode 114 and an upper layer 115 of the first pixel electrode 114 are formed on the uneven pattern unit 113 in the pixel area PXL1.

First, ion impurities D1 are injected into the resultant structure to dope the resultant structure therewith (a first doping process). Boron (B) or phosphorus (P) ions may be injected as the ion impurities D1, and particularly, the ion impurities D1 at a concentration of about $0=10^{15}$ atoms/cm$^2$ or more are injected into the resultant structure by using the active layer 212 of the TFT as a target. By injecting the ion impurities D1 into the active layer 212 by using the gate electrode as a self-aligned mask, the active layer 212 has the source region 212a and the drain region 212b, doped with the ion impurities D1, and the channel region 212c therebetween.

Figure 2D:
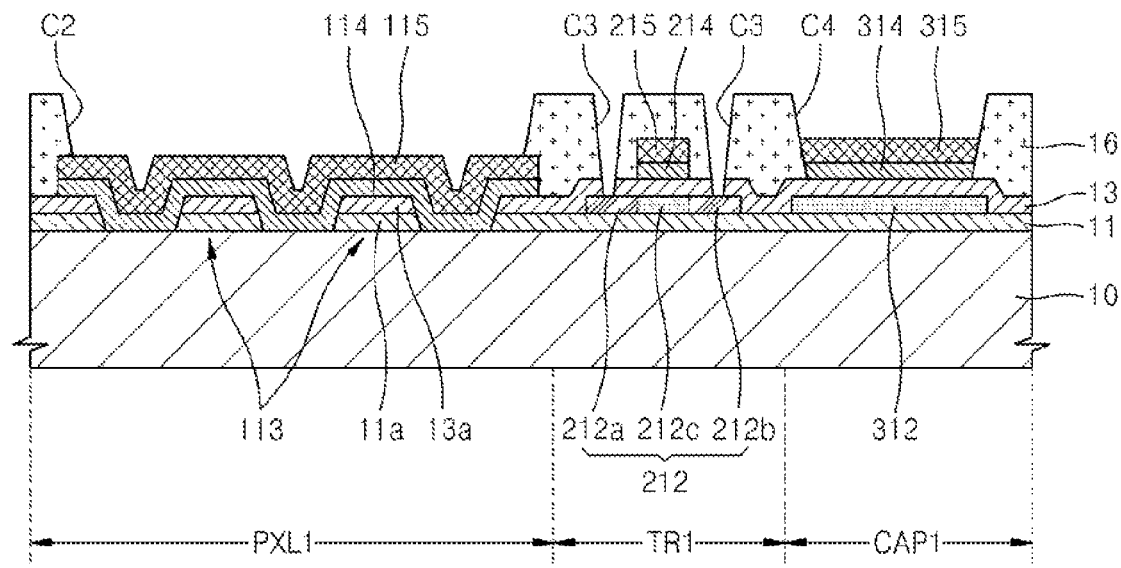

Referring to FIG. 2D, the second insulating layer 16 is formed on the resultant structure of the third masking process of FIG. 2C, and through a fourth masking process, the second insulating layer 16 is patterned to form a second opening C2 through which the upper layer 115 of the first pixel electrode 114 is exposed, a third opening C3 through which the source region 212a and the drain region 212b are exposed, and a fourth opening C4 through which the upper layer 315 of the second electrode 314 of the capacitor is exposed.

Figure 2E:
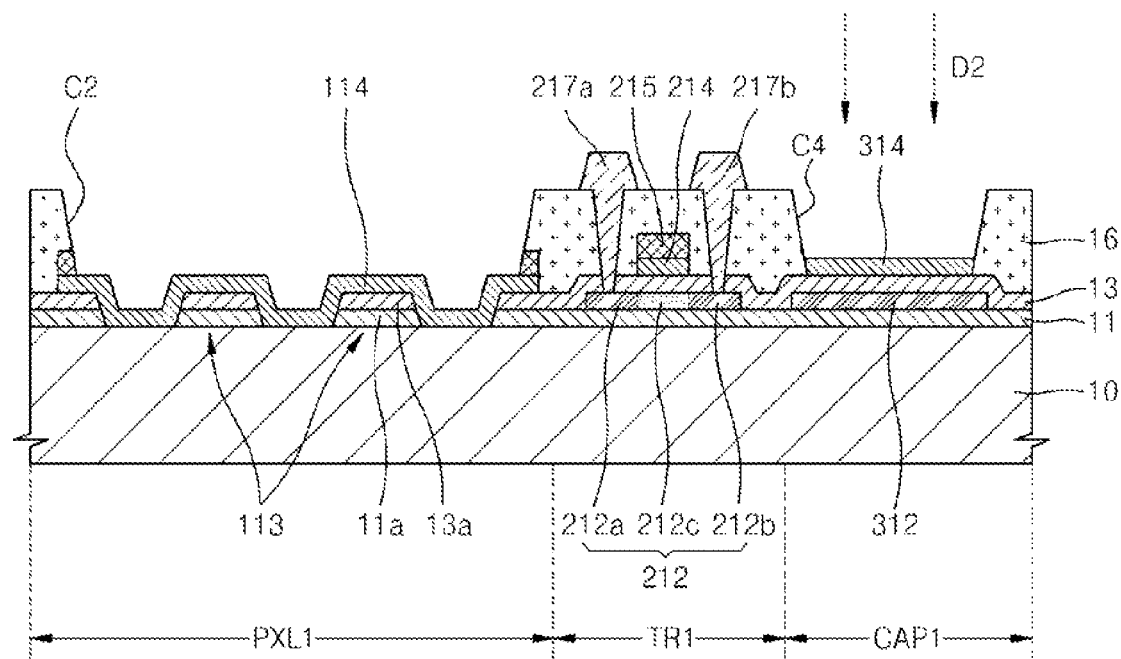

Referring to FIG. 2E, the source electrode 217a and the drain electrode 217b are formed on the resultant structure of the fourth masking process of FIG. 2D.

When the source electrode 217a and the drain electrode 217b are formed through patterning in a fifth masking process, the upper layer 115 of the first pixel electrode 114 and the upper layer 315 of the second electrode 314 are removed.

After removing the upper layer 115 of the first pixel electrode 114 and the upper layer 315 of the second electrode 314, ion impurities D2 are injected into a resultant structure by using the first electrode 312 of the capacitor as a target (a second doping process). The first electrode 312, not doped during the first doping process, is doped with the ion impurities D2 during the second doping process, and thus, the first electrode 312 and the second electrode 314 constitute an MIM capacitor.

Figure 2F:
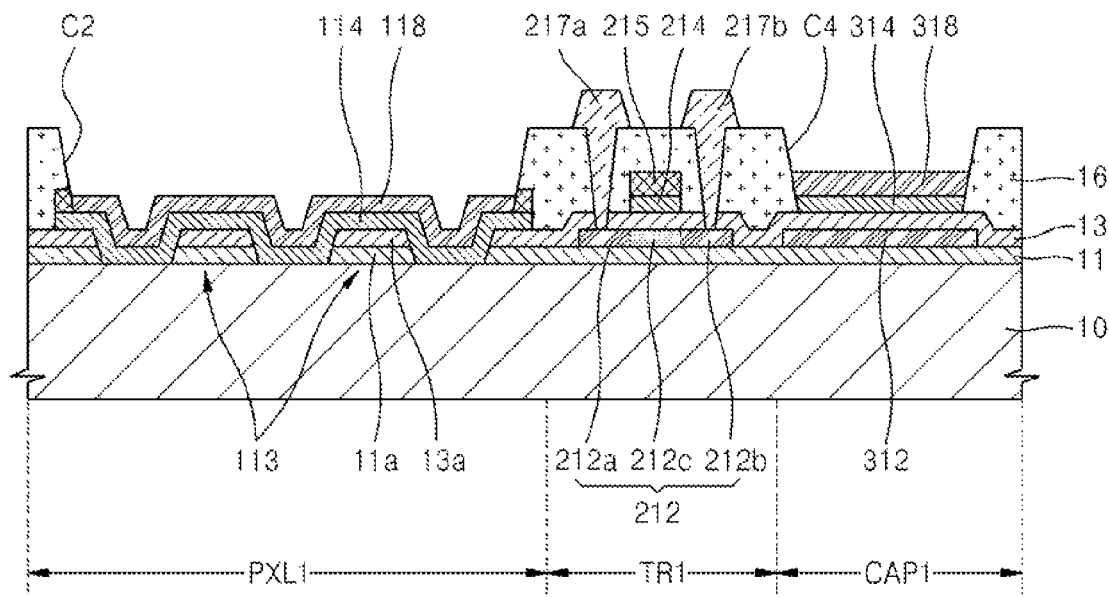

Referring to FIG. 2F, a sixth masking process is performed to form the second pixel electrode 118 and the second layer 318 of the second electrode of the capacitor on the resultant structure of the fifth masking process of FIG. 2E.

The second pixel electrode 118 and the second layer 318 of the second electrode of the capacitor each include a semi-transmissive metal layer including silver (Ag), aluminum (Al), or an alloy thereof. Since a semi-transmissive metal layer is patterned after the formation of the source electrode 217a and the drain electrode 217b, the second pixel electrode 118 and the second layer 318 of the second electrode of the capacitor may be prevented from being damaged in an etching process for forming the source electrode 217a and the drain electrode 217b.

Figure 2G:
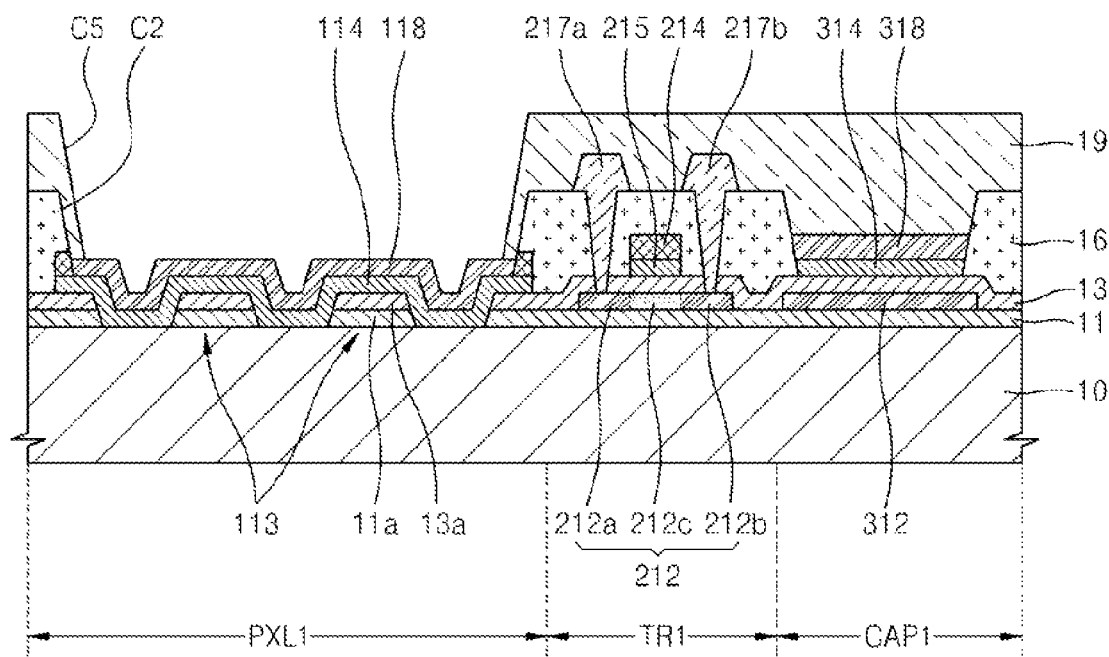

Referring to FIG. 2G, the third insulating layer 19 is formed on a resultant structure of the sixth masking process of FIG. 2F. The third insulating layer 19 is patterned to form the opening C5 through which the second pixel electrode 118 is exposed.

An exemplary embodiment of the present invention will be described below with reference to FIGS. 4 and 5. This description may focus on a difference from the organic light-emitting display device 1 described above with respect to FIGS. 1 through 3. It may be assumed that details not provided are at least similar to those previously described.

Figure 4:
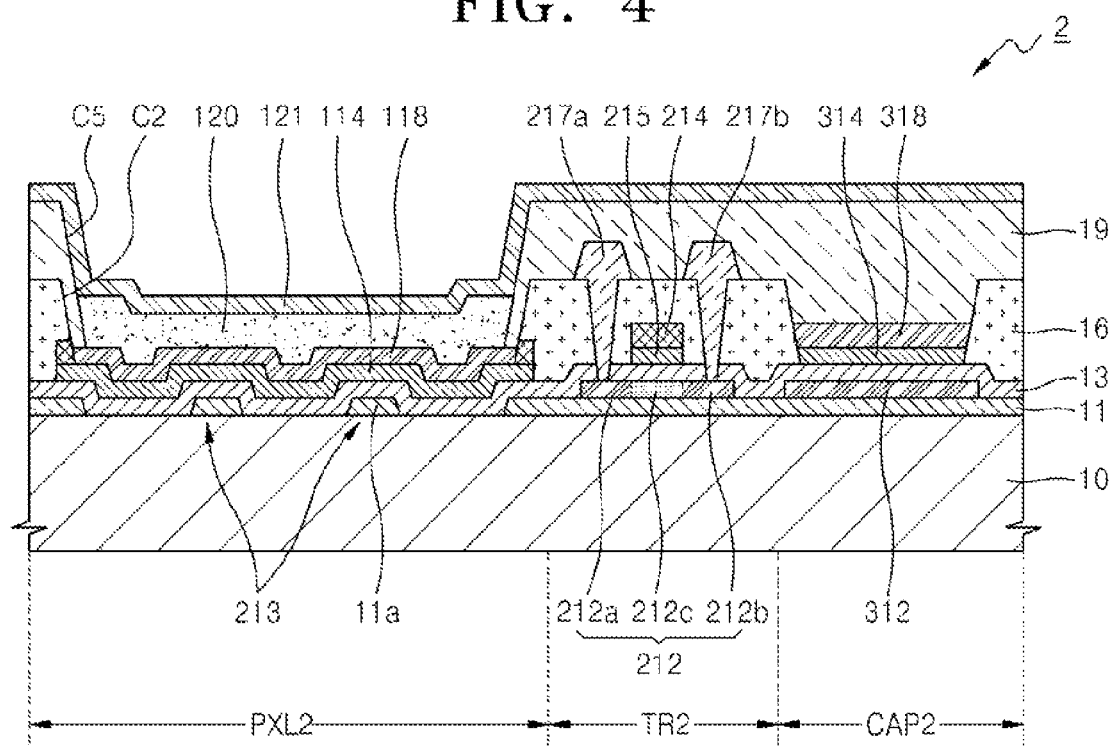
FIG. 4 is a cross-sectional view illustrating an organic light-emitting display device according to an embodiment of the present invention.

FIG. 4 is a cross-sectional view illustrating an organic light-emitting display device 2 according to an embodiment of the present invention.

Referring to FIG. 4, a substrate 10 of the organic light-emitting display device 2 includes a pixel area PXL2, a transistor area TR2, and a capacitor area CAP2. Structures of the transistor and capacitor areas TR2 and CAP2 are the same as those of the transistor and capacitor areas TR1 and CAP1 of the organic light-emitting display device 1 described above.

In the pixel area PXL2, a buffer layer 11 is disposed on the substrate 10. Here, an uneven pattern unit 213 includes an uneven pattern 11a formed by patterning only the buffer layer 11, and a first insulating layer 13 is formed on the substrate 10 to cover the uneven pattern 11a.

A first pixel electrode 114, which includes a transparent conductive oxide, and a second pixel electrode 118, which includes a semi-transmissive metal layer, are sequentially formed on the uneven pattern unit 213 and the first insulating layer 13. An intermediate layer (not shown) including an organic light-emitting layer 120 is disposed on the second pixel electrode 118, and an opposite electrode 121 that is a reflective electrode is disposed on the organic light-emitting layer 120.

By using the uneven pattern unit 213 and a resonance structure, a light extraction efficiency of the organic light-emitting display device 2 may be increased and a color shift may be reduced.

Figure 5:
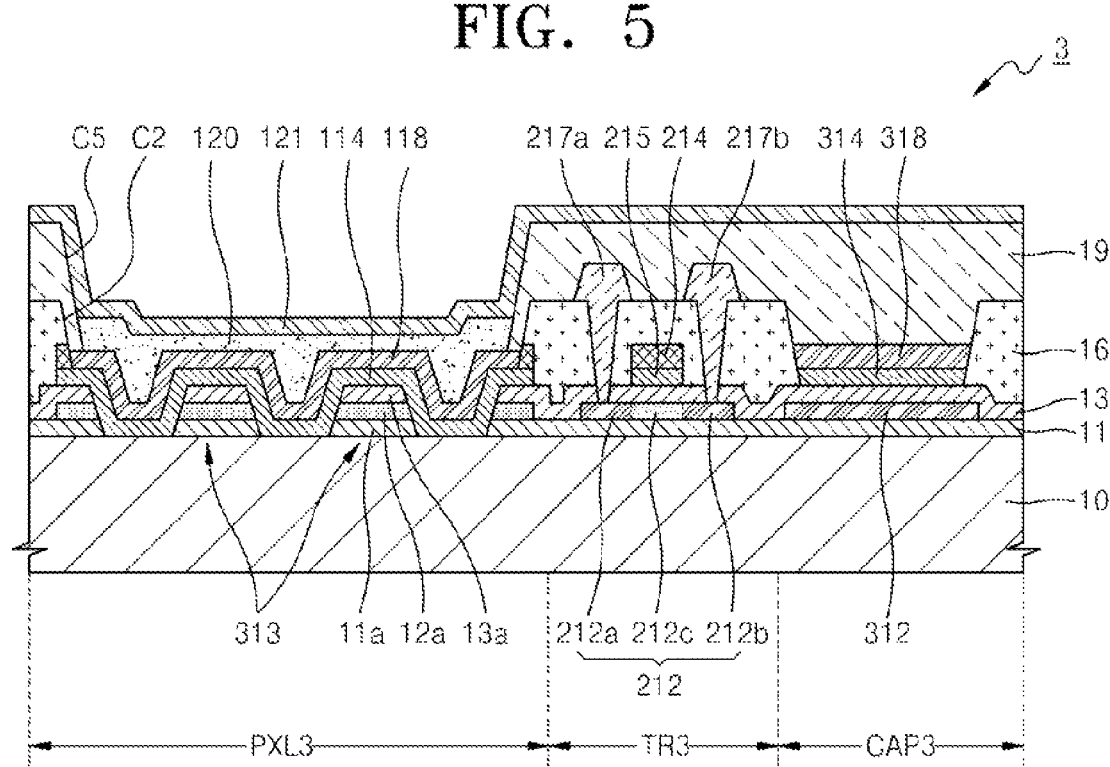
FIG. 5 is a cross-sectional view illustrating an organic light-emitting display device according to an embodiment of the present invention.

FIG. 5 is a cross-sectional view illustrating an organic light-emitting display device 3 according to an embodiment of the present invention.

Referring to FIG. 5, a substrate 10 of the organic light-emitting display device 3 includes a pixel area PXL3, a transistor area TR3, and a capacitor area CAP3. Structures of the transistor and capacitor areas TR3 and CAP3 are the same as those of the transistor and capacitor areas TR2 and CAP2 of the organic light-emitting display device 2.

In the pixel area PXL3, a buffer layer 11 is disposed on the substrate 10. Here, an uneven pattern unit 313 includes an uneven pattern 11a formed by patterning the buffer layer 11, an uneven pattern 12a formed by patterning an active layer 12, and an uneven pattern 13a formed by patterning a first insulating layer 13.

The buffer layer 11, the active layer 12, and the first insulating layer 13 are simultaneously patterned in the same masking process to form the uneven pattern unit 313, and thus the uneven patterns 11a, 11b, and 11c share an etched surface. When the number of layers for forming the uneven pattern unit 313 increases, a pattern size of the uneven pattern unit 313 may be increased, thereby further reducing a color shift.

A first pixel electrode 114, which includes a transparent conductive oxide, and a second pixel electrode 118, which includes a semi-transmissive metal layer, are sequentially formed on the uneven pattern unit 313. An intermediate layer (not shown), including an organic light-emitting layer 120, is disposed on the second pixel electrode 118, and an opposite electrode 121 that is a reflective electrode is disposed on the organic light-emitting layer 120.

By using the uneven pattern unit 313 and a resonance structure, a light extraction efficiency of the organic light-emitting display device 3 may be increased and a color shift may be reduced.

While exemplary embodiments of the present invention have been particularly shown and described with reference to the figures, it will be understood by those of ordinary skill in the art that various changes in form and details may be made therein without departing from the spirit and scope of the present invention.

What is claimed is:

1. An organic light-emitting display device comprising:
   a substrate;
   a buffer layer disposed on the substrate;
   a thin film transistor disposed on the buffer layer, wherein the thin film transistor comprises an active layer, a gate electrode, a source electrode, a drain electrode, a first insulating layer disposed between the active layer and the gate electrode, and a second insulating layer, wherein the second insulating layer is disposed between the gate electrode and the source electrode and between the gate electrode and the drain electrode;
   an uneven pattern unit comprising an uneven pattern formed by patterning the buffer layer, the uneven pattern including a plurality of alternating peaks and valleys;
   a first pixel electrode disposed in an opening formed in the second insulating layer, wherein the first pixel electrode comprises a transparent conductive oxide;
   a second pixel electrode disposed on the first pixel electrode, wherein the second pixel electrode comprises a semi-transmissive layer, the second pixel electrode directly contacting the first pixel electrode;
   an organic lighting-emitting layer formed on the second pixel electrode; and
   an opposite electrode formed on the organic lighting-emitting layer and disposed opposite to the second pixel electrode,
   wherein the organic light-emitting display device comprises a pixel area, a transistor area, and a capacitor area and the uneven pattern unit is located within the pixel area,
   wherein the capacitor area comprises a first capacitor electrode and a second capacitor electrode, the second capacitor electrode comprising two layers;
   the first capacitor electrode formed from a same layer as the active layer, the first capacitor electrode comprising ion impurities;
   a first layer of the two layers of the second capacitor electrode disposed on the first insulating layer, the first layer of the two layers of the second capacitor electrode formed of same materials as the first pixel electrode; and a second layer of the two layers of the second capacitor electrode disposed directly on the first layer of the two layers of the second capacitor electrode, the second layer of the two layers of the second capacitor electrode formed of same materials as the second pixel electrode.

2. The organic light-emitting display device of claim 1, wherein the uneven pattern unit further comprises an uneven pattern formed by patterning the first insulating layer.

3. The organic light-emitting display device of claim 2, wherein the uneven patterns of the uneven pattern unit share a common etched surface.

4. The organic light-emitting display device of claim 2, wherein the uneven pattern unit further comprises an uneven pattern formed by patterning the active layer.

5. The organic light-emitting display device of claim 4, wherein the uneven patterns of the uneven pattern unit share the same etched surface.

6. The organic light-emitting display device of claim 1, wherein the transparent conductive oxide comprises indium tin oxide (ITO), indium zinc oxide (IZO), zinc oxide (ZnO), indium oxide ($In_2O_3$), indium gallium oxide (IGO), or aluminum zinc oxide (AZO).

7. The organic light-emitting display device of claim 1, wherein the semi-transmissive layer comprises silver (Ag), aluminum (Al), or an alloy thereof.

8. The organic light-emitting display device of claim 1, wherein the opposite electrode is a reflective electrode.

9. The organic light-emitting display device of claim 1, wherein the gate electrode comprises:

a first layer comprising a transparent conductive oxide; and a second layer comprising a metal.

10. The organic light-emitting display device of claim 1, wherein the second capacitor electrode is disposed in an opening formed in the second insulating layer.

11. The organic light-emitting display device of claim 1, wherein the first insulating layer is disposed between the first capacitor electrode and the first layer of the two layers of the second capacitor electrode.

12. The organic light-emitting display device of claim 1, further comprising a pixel definition layer, in which an opening is formed spaced apart from the thin film transistor in a lateral direction of the thin film transistor, on the second insulating layer.

13. The organic light-emitting display device of claim 12, wherein the first and second pixel electrodes are disposed in the opening formed in the pixel definition layer.

14. The organic light-emitting display device of claim 1, wherein the uneven pattern including a plurality of alternating non-linear peaks and valleys.

15. The organic light-emitting display device of claim 14, wherein the non-linear peaks have a shape of lines with symmetrically bent ends, circular shapes, or chevron shapes.

16. A method of manufacturing an organic light-emitting display device, the method comprising:

forming a buffer layer on a substrate;

forming a thin film transistor on the buffer layer, the thin film transistor comprising an active layer, a gate electrode, a source electrode, a drain electrode, a first insulating layer disposed between the active layer and the gate electrode, and a second insulating layer disposed between the gate electrode and the source and drain electrodes;

forming an uneven pattern unit comprising a portion of the buffer layer, the uneven pattern including a plurality of alternating peaks and valleys;

forming a first pixel electrode on the uneven pattern unit, the first pixel electrode comprising a transparent conductive oxide;

forming a second pixel electrode directly on the first pixel electrode, the second pixel electrode comprising a semi-transmissive layer;

forming an organic lighting-emitting layer on the second pixel electrode; and forming an opposite electrode on the organic lighting-emitting layer, wherein the organic light-emitting display device comprises a pixel area, a transistor area, and a capacitor area and the uneven pattern unit is formed within the pixel area, wherein the capacitor area comprises a first capacitor electrode and a second capacitor electrode, the second capacitor electrode comprising two layers;

the first capacitor electrode formed from a same layer as the active layer, the first capacitor electrode comprising ion impurities;

a first layer of the two layers of the second capacitor electrode disposed on the first insulating layer, the first layer of the two layers of the second capacitor electrode formed of same materials as the first pixel electrode; and a second layer of the two layers of the second capacitor electrode disposed directly on the first layer of the two layers of the second capacitor electrode, the second layer of the two layers of the second capacitor electrode formed of same materials as the second pixel electrode.

17. The method of claim 16, wherein the second pixel electrode is formed after forming the source electrode and the drain electrode.

18. The method of claim 16, wherein the active layer is doped with ion impurities in a first doping process, and the first capacitor electrode is doped with ion impurities in a second doping process.

19. The method of claim 16, wherein the second layer of the two layers of the second capacitor electrode is formed after forming the source electrode and the drain electrode.

* * * * *